(12) United States Patent
Hirata

(10) Patent No.: US 6,224,950 B1
(45) Date of Patent: *May 1, 2001

(54) METHOD FOR FORMATION OF THIN FILM

(75) Inventor: Noriyuki Hirata, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/672,216

(22) Filed: Jun. 27, 1996

Related U.S. Application Data

(63) Continuation of application No. PCT/JP94/02259, filed on Dec. 27, 1994.

(30) Foreign Application Priority Data

Dec. 27, 1993 (JP) .................................................. 5-329171

(51) Int. Cl.$^7$ ....................................................... H05H 1/24
(52) U.S. Cl. ........................... 427/535; 427/539; 427/578; 427/579; 438/155; 438/158; 438/787; 438/791
(58) Field of Search ..................................... 427/579, 534, 427/535, 539, 578; 438/622, 761, 771, 776, 155, 158; 437/787, 791

(56) References Cited

U.S. PATENT DOCUMENTS

| | | | |
|---|---|---|---|
| 4,310,614 | 1/1982 | Connell et al. | 427/569 |
| 4,895,734 | * 1/1990 | Yoshida et al. | 427/579 |
| 5,211,995 | * 5/1993 | Kuehnie et al. | 427/579 |
| 5,562,952 | * 10/1996 | Nakahigashi et al. | 427/579 |

FOREIGN PATENT DOCUMENTS

| | | |
|---|---|---|
| 60-182127 | 9/1985 | (JP) . |
| 3-120822 * | 5/1991 | (JP) ............................... H01L/21/31 |
| 5-32483 | 2/1993 | (JP) . |
| 63-79970 | 4/1998 | (JP) . |

* cited by examiner

*Primary Examiner*—Shrive Beck
*Assistant Examiner*—Bret Chen
(74) *Attorney, Agent, or Firm*—Finnegan, Henderson, Farabow, Garrett & Dunner, L.L.P.

(57) ABSTRACT

A method is disclosed which forms a thin film by setting a substrate in place in a vacuum vessel provided with a gas inlet and introducing reaction gases through the gas inlet into the vacuum vessel and meanwhile applying a high-frequency electric power to the reaction gases thereby inducing generation of plasma and deposition of the thin film of the reaction product of the reaction gases on the substrate, which method is characterized in that prior to the introduction of the reaction gas, a discharge gas formed of a component gas of the reaction gases which by itself assumes the state of plasma and possesses substantially no ability to form the thin film or a plurality of reaction gases which in itself possesses substantially no ability to form the thin film is introduced into the vacuum vessel and the high-frequency electric power is meanwhile applied to the discharging gas thereby inducing the generation of plasma and effecting a pretreatment, and thereafter the reaction gases are introduced into the vacuum vessel in the place of the discharging gas without substantially changing the conditions for plasma generation thereby effecting the formation of the thin film on the substrate. Thus, this invention allows provision of a method capable of forming the thin film without requiring an operation for evacuation of the vacuum vessel to a high degree of vacuum.

29 Claims, 5 Drawing Sheets

METHOD FOR FORMATION OF THIN FILM

This application is a Continuing Application of PCT International Application No. PCT/JP94/02259 filed Dec. 27, 1994.

TECHNICAL FIELD

This invention relates to a method for forming a thin film by the plasma CVD technique on a substrate such as, for example, a glass substrate which is subjected to a treatment.

BACKGROUND ART

As a means for forming a multilayer thin film on a substrate, a method which implements the formation of such film by means of a CVD apparatus comprising a plurality of film-forming chambers each having parallel planar electrodes installed therein has been known to date.

Now, a method for forming a silicon nitride film (film A) and an amorphous silicon film (film B) on a substrate by the use of a conventional CVD apparatus comprising a plurality of film-forming chambers each having parallel planar electrodes installed therein will be described below with the aid of a flow chart of FIG. 6.

First, a substrate such as of glass is introduced into a film-forming chamber I for the formation of a film A and set in place on the lower one of parallel planar electrodes (1). The chamber is evacuated to a high degree of vacuum (not higher than $1 \times 10^{-1}$ Pa, for example) prior to the formation of the film (2), reaction gases A (monosilane, ammonia, or nitrogen) necessary for the formation of the film A are introduced into the film-forming chamber I and the reaction gases A in the chamber are adjusted to a pressure permitting plasma discharge (3), and an electric power is supplied from a high-frequency power source to the opposed electrodes to initiate plasma discharge and deposition of the thin film A on the substrate (4). After the discharge is continued for a prescribed period of time, the supply of the electric power from the high-frequency power source is cut off to stop the plasma discharge and, at the same time, the supply of the reaction gases A is stopped (5). The film-forming chamber I is evacuated to the high degree of vacuum (not higher than $1 \times 10^{-1}$ Pa, for example) mentioned above (6) and the substrate having the thin film A formed thereon is removed from within the evacuated film-forming chamber I without lowering the degree of vacuum (7) and is introduced into a film-forming chamber II for the formation of film B (8). In the film-forming chamber II, the steps of operation performed in the film-forming chamber I are similarly carried out sequentially; the chamber is evacuated prior to the formation of film (9), reaction gases B (monosilane hydrogen) are introduced into the chamber and then adjusted to a stated pressure (10), plasma discharge is continued for a stated period of time (11), the plasma discharge is stopped (by stopping the supply of the reaction gas) (12), the chamber is evacuated after the formation of the film (13), and thereafter the substrate is transferred from the chamber (14).

The evacuation prior to the formation of the film carried out each at the steps (2) and (9) mentioned above is aimed at expelling impure gas, cleaning the surface of the substrate and the empty space for discharge to the fullest possible extent, and preventing entry of impurities into the interface between the substrate and the thin film to be formed thereon and into the thin film itself. To fulfill this aim in the manufacture of a thin film transistor under a prescribed pressure of 100 Pa, for example, the evacuation must be performed until the pressure reaches $1/1000$ of the prescribed pressure, namely not more than $10 \times 10^{-1}$ Pa. For the evacuation prior to the formation of the film, therefore, a wide-range turbo molecular pump having an ample capacity to evacuate is used. The pump requires a period of about 60 seconds to lower the pressure to this level. In the introduction of the reaction gases A or B into the film-forming chamber and the adjustment of the pressure therein at the step (3) or (10), the reaction gases are exclusively introduced into the film-forming chamber in which a clean atmosphere has been established in consequence of the evacuation prior to the formation of the film and the reaction gases in the chamber are adjusted over a period of about 30 seconds preceding the start of discharge to a pressure necessary for continuation of the discharge and retained at this pressure thence. A flow rate adjusting mechanism is used for the introduction of the gas and an automatic pressure control valve is used for the pressure adjustment. After the interior of the film-forming chamber is adjusted to the prescribed pressure with the reaction gas, the plasma discharge at the step (4) or (11) is started. The film thickness is adjusted by controlling the duration of the plasma discharge before the stop of discharge at the step (5) or (12).

Specifically, for forming the film A (silicon nitride) in a thickness of 400 nm and the film B (amorphous silicon) in a thickness of 300 nm, the plasma discharge must be continued for 120 seconds and 360 seconds respectively. The supply of the reaction gases is stopped at the same time that the discharge is stopped. Then, the evacuation of the chamber after the formation of the film is immediately carried out at the step (6) or (13). This evacuation is performed for the same purpose as the evacuation before the formation of the film mentioned above. Similarly to the evacuation before the formation of the film, the present evacuation is carried out by the use of the wide-range turbo molecular pump over a period of 90 seconds.

For a thin film transistor comprising such film A (silicon nitride) and film B (amorphous silicon) as mentioned above to be continuously formed on a substrate in a vacuum by the plasma CVD technique using parallel planar substrates, it is necessary to use two film-forming chambers. The time required for the formation of the film in this case is 840 seconds in total.

In the formation of film by the use of the conventional CVD apparatus as mentioned above, it is customary to evacuate the film-forming chamber to a high degree of vacuum for the sake of creating a clean atmosphere in the chamber prior to the formation of the film. This evacuation, therefore, not only requires use of the wide-range turbo molecular pump of a fully ample capacity but also entails the problem of necessitating such a duration of time in establishing a prescribed degree of vacuum in the film-forming chamber as may be equal to or more than that which is required before and after the formation of the film.

Further, with the conventional CVD apparatus, the formation of multilayer films requires as many film-forming chambers as the kinds of films involved, which entails the problem of adding to the cost of equipment and enlarging the size of the apparatus and necessitating a proportionately large floor area for the installation of the apparatus.

Besides, since the adjustment of the film thickness depends on the control of the duration of the discharge, a problem ensues that the time of actual start of the discharge is not easily detected accurately and the adjustment of the film thickness is not easily attained with high repeatability.

Another problem further arises that when the electric power from the high-frequency power source is applied, the reflected power from the electrode plate after start of the discharge is large as shown in FIG. 7 and, as a result, the state of initial plasma between the time the reflected power begins to diminish and the time it eventually stabilizes differs from the subsequent state of plasma and the film initially deposited differs in quality from that deposited subsequently. This problem gains in prominence proportionately as the speed of film deposition is increased, namely as the magnitude of the electric power to be applied and the amount of the reaction gases to be supplied are increased. The attempt to confer perfect quality on the film during the initial deposition, therefore, tolerates no large addition to the speed of film deposition and suffers an increase in the time required for the film formation and a decrease in productivity of the film formation.

One object of this invention, therefore, is to provide a method for forming a thin film, which obviates the necessity for such means of evacuation as a wide-range turbo molecular pump which is capable of attaining a high degree of vacuum.

A further object of this invention is to provide a method for forming a thin film, which enables a multilayer film to be continuously formed in a sole film-forming chamber and, therefore, permits miniaturization of an apparatus.

Another object of this invention is to provide a method for forming a thin film, which enables a multilayer film to be produced homogeneously in film thickness and in film quality as well.

Yet another object of this invention is to provide a method for forming a thin film, which requires a short time in the formation of the film and enjoys perfect productivity.

Still another object of this invention is to provide a method for producing a semiconductor device which uses a film formed of a plurality of superposed layers including a semiconductor film and excels in properties.

DISCLOSURE OF THE INVENTION

This invention is directed to a method for forming a thin film by setting a substrate in place in a vacuum vessel provided with a gas inlet and introducing one or more kinds of reaction gases through the gas inlet into the vacuum vessel and meanwhile applying a high-frequency electric power to the reaction gases thereby inducing generation of plasma and deposition of the thin film of the reaction product of the reaction gases on the substrate, characterized in that prior to the introduction of the reaction gases, a discharge gas formed of a component gas of the reaction gases which by itself assumes the form of plasma and possesses substantially no ability to form the thin film, namely at least one of the two or more kinds of gases mentioned above which in itself possesses substantially no ability to form the thin film, is introduced into the vessel and the high-frequency electric power is meanwhile applied to the discharging gas thereby inducing the generation of plasma and effecting a pretreatment, and thereafter the reaction gases mentioned above are introduced into the vessel in the place of the discharging gas without substantially changing the conditions for plasma generation thereby effecting the formation of the thin film on the substrate.

As a concrete example of the vacuum vessel provided with the gas inlet and used for this invention, the well-known plasma CVD device using parallel planar plates may be cited.

The plasma generating device using parallel planar plates is generally composed of a vacuum vessel (film-forming chamber) provided with a plurality of gas inlets and having a pair of vertically opposed parallel planar electrodes disposed therein, a reaction gas supply system for supplying reaction gases to the vacuum vessel, a high-frequency power source for applying a high-frequency voltage of 13.56 MHz to the parallel planar electrodes, etc.

The formation of the film is implemented by setting a substrate on the lower electrode and introducing through the gas inlet the discharging gas for the former step and then the reaction gases for the subsequent step and meanwhile applying the high-frequency electric power to the parallel planar electrodes thereby inducing generation of plasma.

As the discharging gas for use at the step of pretreatment, (a) hydrogen gas as a component of silane gas is used when the reaction at the subsequent step is the formation of an amorphous silicon film, (b) (1) hydrogen gas, (2) nitrogen gas, or (3) ammonia gas which is a compound of hydrogen, a component element of silane gas, and nitrogen, a component element of nitrogen gas is used when the reaction is the formation of a silicon nitride film, or (c) oxygen gas is used when the reaction is the formation of a silicon oxide film.

Particularly, in the production of a semiconductor device which is formed of a plurality of superposed layers including a semiconductor film, when the reaction of the subsequent step is the formation of the amorphous silicon film, use of hydrogen gas as the discharging gas results in generating an Si—H bond in the interface of amorphous silicon and brings about an effect of improving the properties of the produced semiconductor device.

In this invention, the gas pressure in the vacuum vessel is set at an appropriate level in the range of 100~300 Pa, depending on the quality of the film to be formed. Throughout the whole process of operations performed in this invention, the vacuum vessel is not required to be evacuated to any degree of vacuum lower than 10 Pa. Thus, this invention has no use for such a vacuum pump as the wide-range turbo molecular pump which has a large capacity for evacuation.

In this invention, the formation of the film by the use of the CVD device using parallel planar electrodes, for example, is carried out as follows.

First, the substrate such as, for example, a glass substrate is placed on the lower one of the parallel planar electrodes. Then, the discharging gas is introduced into the device and a high-frequency electric power of 13.56 MHz is meanwhile applied from the high-frequency power source to the distance between the parallel planar electrodes. At this time, the total flow rate of treating gases, the gas pressure, the distance between the electrodes, and the electric power to be supplied are fixed at the relevant magnitudes which are set in advance, depending on the kind of a film to be formed.

This plasma discharge cleans the surface of the substrate. After the discharge is continued for a prescribed period of time and the condition of discharge is stabilized, the supply of the discharging gas is stopped and supply of the reaction gases is started. At this time, prior to the supply of the reaction gas, the distance between the electrodes is adjusted to suit the kind of the film to be formed. Though the gas pressure and the electric power to be supplied need not be varied, they may be adjusted as occasion demands. In this case, the pressure of the discharging gas to be supplied is in the range of 10~100% of the pressure of the reaction gases to be supplied and the magnitude of the electric power under supply of the discharging gas is in the range of 50~100% of the magnitude of the electric power under supply of the reaction gas.

The period of time during which the plasma discharge is generated during introduction of the discharging gas is preferably in the range of 10 to 40 percent (%) of the period of time of the plasma discharge under the reaction gases. When the discharging gas is switched to the reaction gases while the plasma discharge is kept intact, it is proper to carry out the introduction of the reaction gases while allowing the gas pressure and the electric power for discharging to remain at their constant levels.

In the formation of a film which is formed of a plurality of superposed layers, a procedure which comprises continuing the formation of a first film for a prescribed duration of time, then stopping the supply of the reaction gas, and introducing a discharging gas corresponding to a second film while retaining the plasma discharge is repeated.

This invention is advantageously utilized in forming a film by superposing a plurality of layers like silicon nitride—amorphous silicon—silicon nitride, or silicon oxide—silicon nitride—amorphous silicon—silicon nitride and, therefore, is advantageously adopted in the process for production of a channel etching type or a channel insulating film type amorphous silicon TFT (inverted stagger type or stagger type) using the thin film of such a layer construction as mentioned above.

In the method of this invention for the formation of the thin film, when the discharging gas formed of such a component gas of the reaction gases as has nothing to do with the formation of the thin film is caused to generate discharge prior to the formation of the thin film, the film-forming chamber and the substrate are exposed to an activated atmosphere and the impure gas existing formerly in the film-forming chamber is easily displaced with the discharging gas at the time that the discharge is started. Thus, the formation of the thin film can be performed in a clean atmosphere without requiring the chamber to be evacuated to a high degree of vacuum by the use of the wide-range turbo molecular pump before and after the formation of the film. The thin film of fine quality aimed at, therefore, can be obtained quickly without entry of any impurities during the initial stage of the formation of the thin film. After the elapse of a prescribed period of time following the start of the discharge, the state of plasma can be stably retained when the plasma discharge is made to continue with a substantially equal discharging electric power by causing the gas component of the discharging gas which has nothing to do with the formation of the thin film and the reaction gases formed of the gas component which are responsible for the formation of the thin film to be introduced under substantially equal gas pressures without varying the electric power for discharging. Thus, the film formed during the initial stage of deposition and the film formed thereafter have an equal quality and the thickness of the film is easily controlled.

Particularly by using hydrogen gas as the discharging gas in the formation of the thin film comprising a plurality of superposed layers including a semiconductor film, it is enabled to produce a semiconductor device which has the interface of semiconductor in an improved state and consequently exhibits excellent properties.

BEST MODE FOR CARRYING OUT THE INVENTION

EXAMPLE 1

A working example of this invention applied to a production of a semiconductor film comprising silicon nitride (film A) and amorphous silicon (film B) by the plasma CVD technique using parallel planar plates will be described below with reference to FIG. 1 and FIG. 2.

Figure 1:
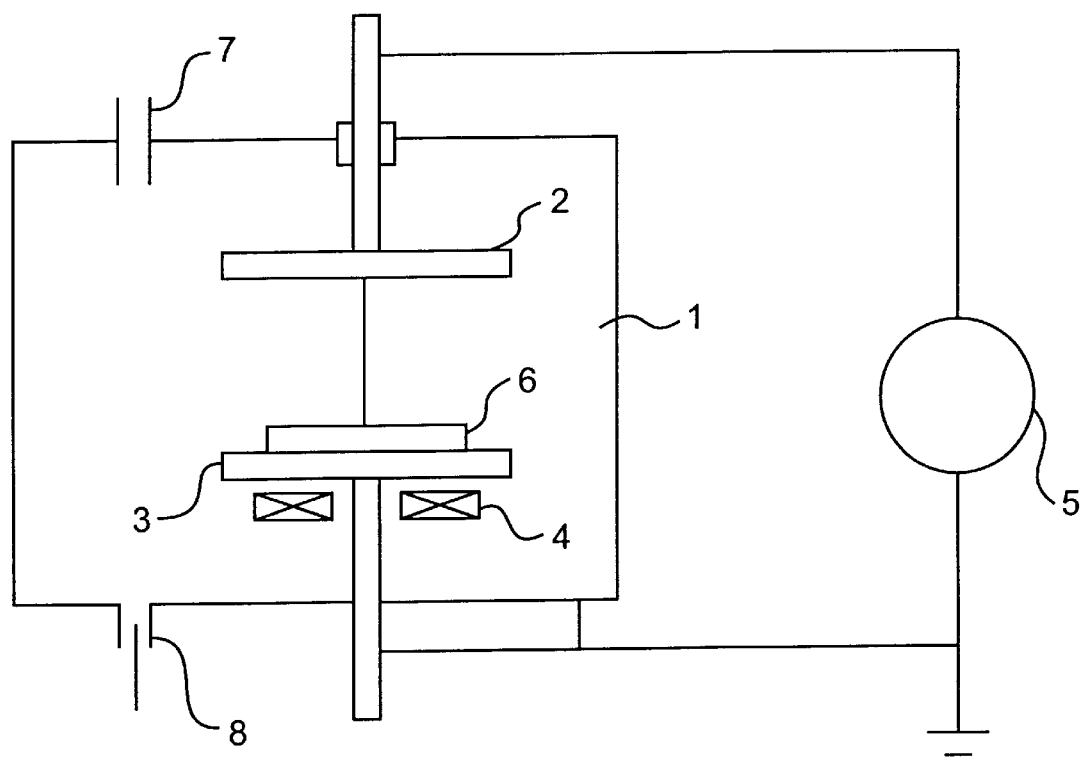
FIG. 1 is a diagram for conceptually showing a CVD device used in a working example of this invention.
Figure 2:
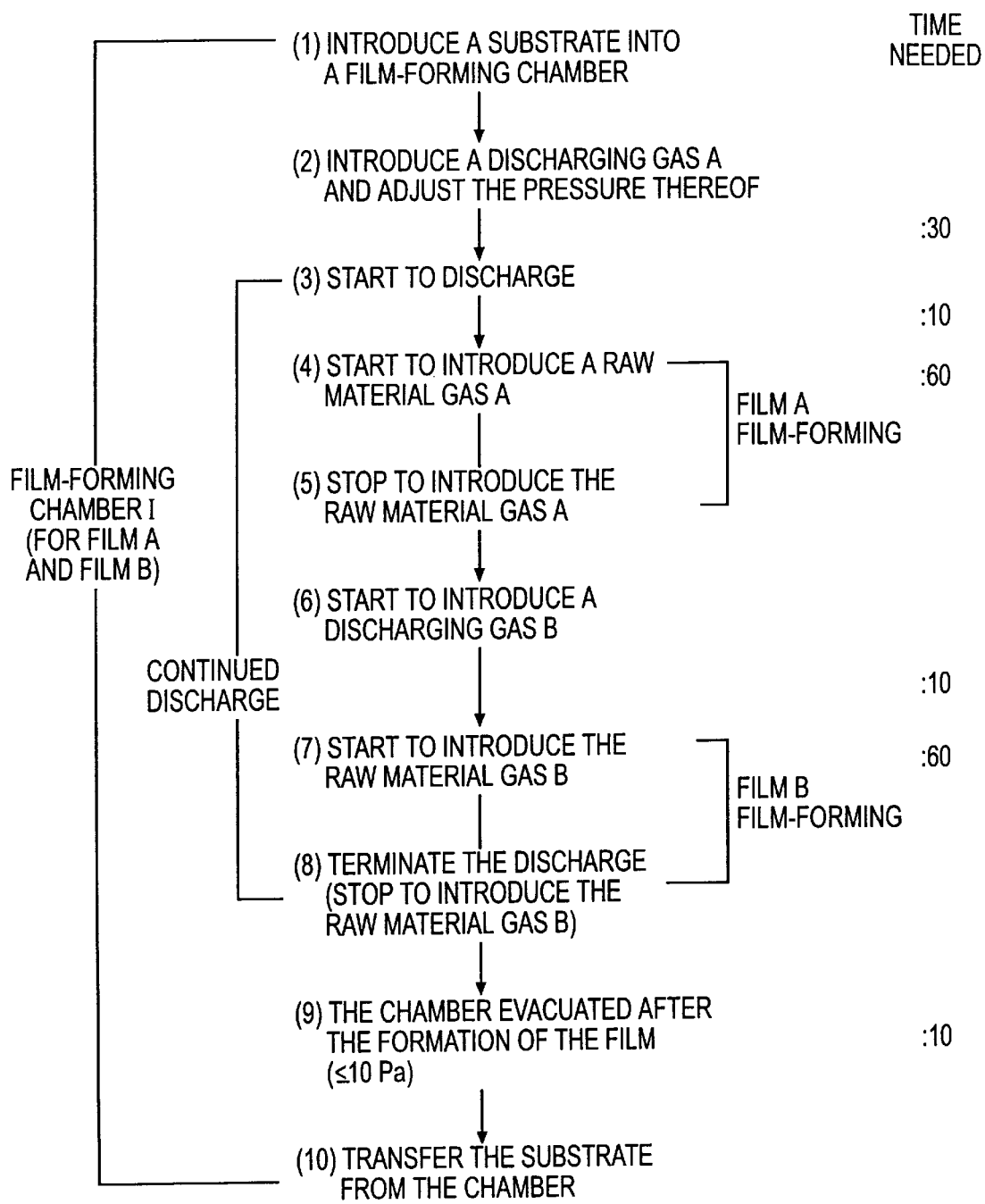
FIG. 2 is a flow chart of one working example of this invention.

FIG. 1 is a diagram for conceptually showing a CVD device to be used in this invention and FIG. 2 is a flow chart as an aid to the description of a method for producing a semiconductor film by the CVD method of this invention using parallel planar plates.

With reference to FIG. 1, in a film-forming chamber 1 which is constructed tightly in vacuum, plasma generating electrodes 2 and 3 vertically opposed across an intervening space are disposed. The upper electrode 2 is supported as electrically insulated from the film-forming chamber 1 and exposed inside the film-forming chamber 1 and the lower electrode 3 is underlain by a heater 4. The lower electrode 3 is grounded together with the film-forming chamber 1 and a high-frequency power source 5 is disposed to interconnect the grounded lower electrode 3 and the upper electrode 2. A substrate 6 for chemical vapor-phase growth is set on the lower electrode 3. A plasma is generated by applying a high-frequency electric power to the two electrodes mentioned above in a blanket of reaction gases introduced via a gas inlet 7 into the film-forming chamber 1 so as to induce chemical vapor-phase growth of the film-forming component of the gas on the substrate 6. The reference numeral 8 denotes a spent gas outlet which is made to communicate with an evacuation pump omitted from illustration.

The parenthesized reference numerals appearing in the following description represent the steps which are shown in the flow chart of FIG. 2.

In this example, first the substrate was transported into the film-forming chamber I for forming a film by superposing a silicon nitride film and an amorphous silicon film (1). In preparation for the formation of the film A, the substrate and the film-forming chamber were purged of impurities and, further for the purpose of stabilizing the discharge to be started thereafter, a discharging gas A (nitrogen gas) containing no monosilane was exclusively introduced into the chamber and then the discharging gas A in the chamber was adjusted to a pressure (100~300 Pa) which would permit a prescribed plasma discharge to proceed (2).

At this time, it took 30 seconds for the adjusted pressure to be stabilized. A flow rate controlling mechanism was used for the introduction of the gas and an automatic pressure control valve was used for the adjustment of the pressure (2). Then, a high-frequency electric power from the high-frequency power source was applied to the upper electrode 2 to commence discharge between the upper electrode 2 and the lower electrode 3 supporting the substrate (3). The ensuing discharge was left proceeding for 10 seconds until the plasma discharge was stabilized. Then, reaction gases A (monosilane and nitrogen gas) necessary for the formation of the silicon nitride film were introduced into the chamber for 60 seconds to effect deposition of a thin film of silicon nitride in a thickness of 400 nm on the substrate (4).

Thereafter, the introduction of the raw material gas A was stopped to terminate the deposition of silicon nitride on the substrate (5) and, at the same time, for the purpose of stabilizing the discharge in preparation for the formation of the amorphous silicon film, the discharge still in process was allowed to continue and the introduction and adjustment of hydrogen gas (a discharging gas B), a component element gas for the raw material gas B (monosilane), were carried out (6). At this time, the electric power applied to the electrodes, the magnitude of the pressure subjected to adjustment, and the distance separating the two electrodes may be altered, as occasion demands. For the sake of continuous deposition of amorphous silicon, it is proper for the magnitude of the pressure subjected to adjustment to be set at a level in the range of 150~300 Pa.

After the discharge lasted for 10 seconds, the introduction of the raw material gas B (monosilane) was started (7). The ensuing discharge was continued for 60 seconds to effect deposition of a film of amorphous silicon in a thickness of 300 nm.

Thereafter, the supply of the electric power from the high-frequency power source was stopped to terminate the discharge and, at the same time, the supply of the raw material gas B was stopped to terminate the deposition of the amorphous silicon film on the substrate (8). Then, the film-forming chamber was evacuated until the degree of vacuum therein reached a medium level of not more than 10 Pa (9) and the substrate was transferred from the film-forming chamber (10). Owing to the use of a drive pump having an ample evacuating capacity, the time required for the evacuation after the formation of film was 10 seconds.

As compared with the conventional method for the formation of the film which required two film-forming chambers and consumed 840 seconds, the method of the present example required only one film-forming chamber in obtaining continuous formation of the film and consumed a total of 180 seconds for the formation of the film as described above.

Further in the present example, the influence of impurities could be always retained and restrained to the least possible extent by setting the duration of the discharge in the gas containing no monosilane at not less than 10 seconds.

Figure 7:
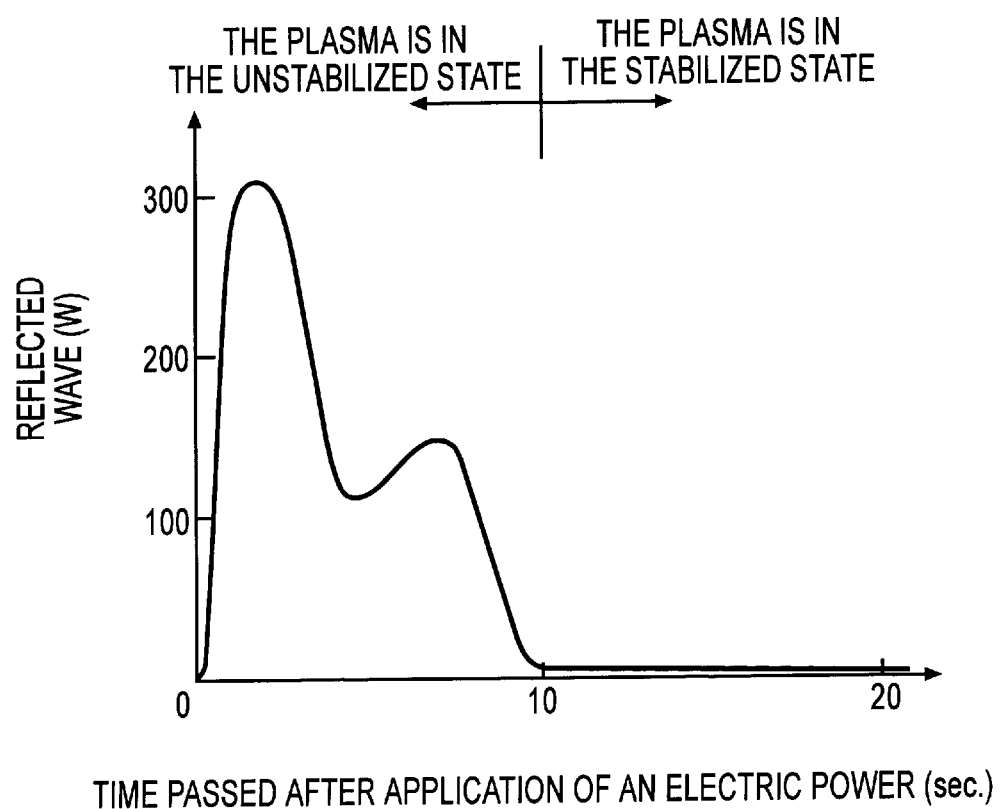
FIG. 7 is a graph showing a change of reflected power after application of an electric power.
Figure 6:
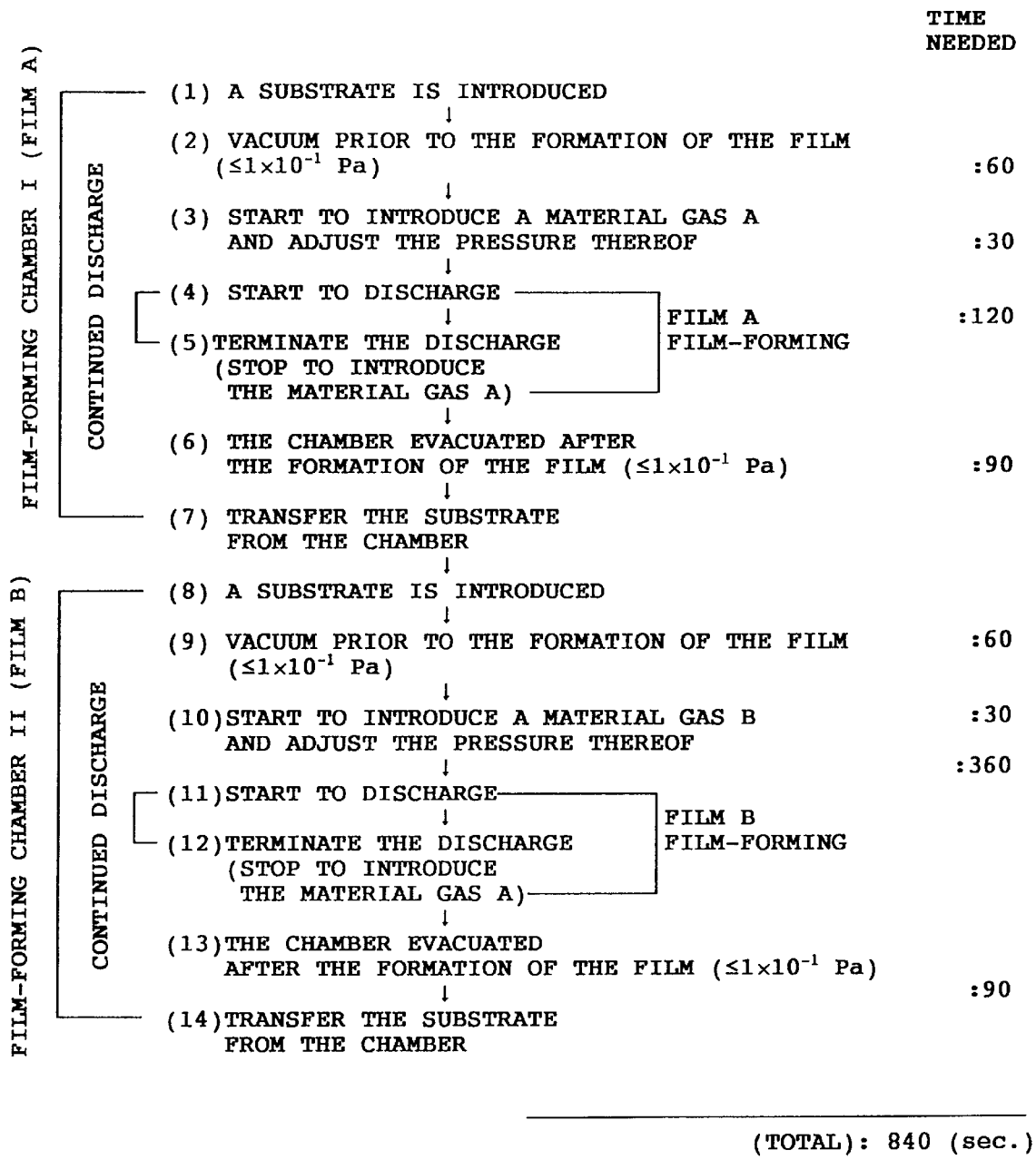
FIG. 6 is a flow chart of a method for forming a thin film by the conventional plasma CVD technique using parallel planar plates.

Since the introduction of monosilane was started after the discharge (state of plasma) was stabilized as described above, the formation of the film in the state of initial plasma shown in FIG. 7 was absent and the film formed during the initial stage of deposition acquired good quality.

By the method of this example, therefore, the interface of the deposited film acquires perfect quality such as to permit a production of a thin film transistor of highly satisfactory properties.

Although the present example effected the formation of a film of a silicon nitride film and an amorphous silicon film in a single film-forming chamber, the procedure of this example permits continuous formation of three or more kinds of thin films by the use of a single film-forming chamber. Incidentally, in the continuous formation of a multiplicity of kinds of thin films, the discharge may be temporarily stopped after the formation of one kind of thin film and before the formation of another kind of thin film or, when necessary, the film-forming chamber may be evacuated.

The discharge with the discharging gas and the discharge with the reaction gases may be carried out with intermissions of not more than one second. In addition, the high-frequency electric power may be supplied intermittently like a pulse.

In summary, this example consists in implementing the formation of a plurality of thin films in one and the same film-forming chamber, introducing a discharging gas into the film-forming chamber, wherein the discharging gas is one of the reaction gases which will not contribute to the formation of the film, adjusting the pressure of the discharging gas, causing the discharging gas to assume the state of plasma, cleaning the surface for the formation of the film, and continuously using the clean discharging gas as part of the reaction gases for the formation of the film.

Since this example is adapted to use the discharging gas excluding monosilane and possessing in itself no ability to form a thin film in effecting discharge prior to the formation of the thin film and, after the elapse of a prescribed period of time, introduce monosilane into the space of discharge while continuing the discharge meanwhile and to start the formation of the thin film consequently, it enables the substrate to be exposed to an activated atmosphere at the time of starting the discharge, obviates the necessity for evacuating the film-forming chamber by the use of a wide-range turbo molecular pump before and after the formation of the film, permits the formation of the thin film to be attained in a clean atmosphere, and produces quickly the thin film of fine quality having no impurities incorporated therein during the initial stage of the formation of the film. Thus, the film-forming chamber is required to be evacuated only to a medium degree in the approximate range of several Pa~300 Pa and this evacuation can be accomplished with such an evacuation device as a dry pump and finds no use for a pump adapted to establish a high degree of vacuum.

Further, the method of this example enjoys such improved productivity as is evidenced by the fact that a brief period of 60 seconds suffices for forming the thin film as compared with the conventional method which requires 120 seconds in forming a silicon nitride film 400 nm in thickness and 360 seconds in forming an amorphous silicon film 300 nm in thickness. To be specific, this invention permits the speed of the growth of the film to be substantially exalted because the deposition of the film is started after the state of plasma is stabilized and, therefore, the film formed during the initial stage of the deposition and the film formed thereafter have equal quality. It also enjoys perfect repeatability of a film thickness because the control of the film thickness is attained by simply managing the period of time for the supply of monosilane. For the production of a thin film transistor, the present example has only to use one film-forming changer and spend 180 seconds as compared with the conventional method which uses two film-forming chambers and spends 840 seconds.

EXAMPLE 2

Figure 3:
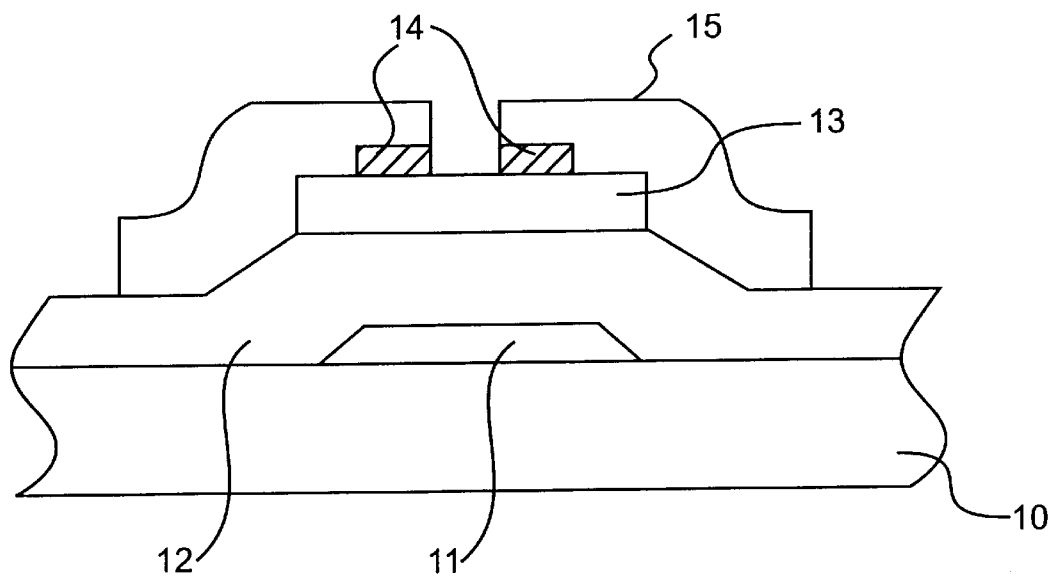
FIG. 3 is a diagram for schematically showing a channel etching type TFT manufactured by using this invention.

By the use of a CVD device using parallel planar plates shown in FIG. 1, a channel etching type TFT (inverted stagger type) shown in FIG. 3 was produced on a glass substrate 370 mm×470 mm in area by the well-known etching technique under the conditions of the film formation shown in Table 1.

TABLE 1

| Sequence | Kind of film | Flow rate of discharging gas (sccm) | | | | | Flow rate of raw material gas (sccm) | | | | | | Electric power (W) |
|---|---|---|---|---|---|---|---|---|---|---|---|---|---|
| | | N$_2$O | NH$_3$ | N$_2$ | H$_2$ | PH$_3$ | SiH$_4$ | N$_2$O | NH$_3$ | N$_2$ | H$_2$ | PH$_3$ | |
| 1 | Silicon nitride | 2000 | 5000 | — | — | — | 300 | — | 2000 | 5000 | — | — | 2500 |
| 2 | Amorphous silicon | — | — | — | 3000 | — | 500 | — | — | — | 3000 | — | 300 |
| 3 | Doped amorphous silicon | — | — | — | 1000 | 1000 | 300 | — | — | — | 1000 | 1000 | 300 |

| Sequence | Kind of film | Pressure (Pa) | Distance between opposed electrodes (mm) | Time required (sec) Discharging | Film formation | Temperature of film formation (C °) | Film thickness (nm) |
|---|---|---|---|---|---|---|---|
| 1 | Silicon nitride | 200 | 20 | 10 | 60 | 350 | 400 |
| 2 | Amorphous silicon | 300 | 15 | 10 | 60 | 300 | 300 |
| 3 | Doped amorphous silicon | 300 | 20 | 10 | 20 | 300 | 100 |

With reference to FIG. 3, 10 stands for a glass substrate, 11 for a metal, 12 for a gate silicon nitride film, 13 for an amorphous silicon film, 14 for a doped amorphous silicon film, and 15 for a metal electrode. In this example, the present invention was used for the formation of a gate silicon nitride film—amorphous silicon film—n$^+$ silicon film.

EXAMPLE 3

Figure 4:
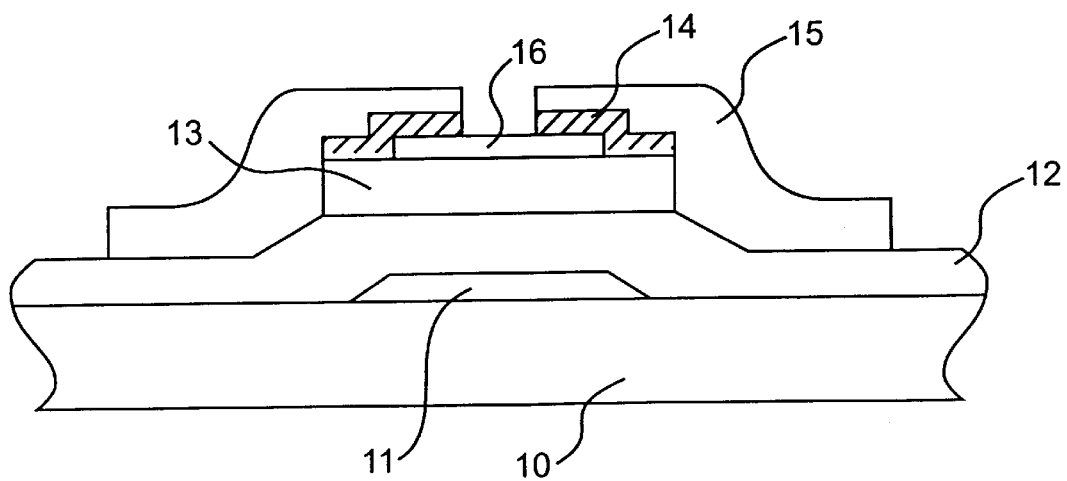
FIG. 4 is a diagram for schematically showing a channel insulating type TFT manufactured by using this invention.

By the use of a CVD device using parallel planar plates shown in FIG. 1, a channel insulating type TFT (inverted stagger type) shown in FIG. 4 was produced on a glass substrate 370 mm×470 mm in area by the well-known etching technique under the conditions of the film formation shown in Table 2.

The numerals in FIG. 4, which represent elements respectively, correspond to those in FIG. 3. The numeral 16 represents a channel protection film of silicon nitride film.

TABLE 2

| Sequence | Kind of film | Flow rate of discharging gas (sccm) | | | | | Flow rate of raw material gas (sccm) | | | | | | Electric power (W) |
|---|---|---|---|---|---|---|---|---|---|---|---|---|---|
| | | N$_2$O | NH$_3$ | N$_2$ | H$_2$ | PH$_3$ | SiH$_4$ | N$_2$O | NH$_3$ | N$_2$ | H$_2$ | PH$_3$ | |
| 1 | Silicon nitride | 1000 | — | 4000 | — | — | 300 | 1000 | — | 4000 | — | — | 1500 |
| 2 | Amorphous silicon | — | 2000 | 5000 | — | — | 300 | — | 2000 | 5000 | — | — | 2000 |
| 3 | Doped amorphous silicon | — | — | — | 3000 | — | 500 | — | — | — | 3000 | — | 200 |
| 4 | Silicon nitride | — | — | 5000 | 1000 | — | 300 | — | 2000 | 5000 | — | — | 2000 |

| Sequence | Kind of film | Pressure (Pa) | Distance between opposed electrodes (mm) | Time required (sec) Discharging | Film formation | Temperature of film formation (C °) | Film thickness (nm) |
|---|---|---|---|---|---|---|---|
| 1 | Silicon nitride | 200 | 25 | 10 | 60 | 350 | 300 |
| 2 | Amorphous silicon | 200 | 20 | 10 | 30 | 350 | 100 |
| 3 | Doped amorphous silicon | 300 | 20 | 10 | 60 | 300 | 100 |
| 4 | Silicon nitride | 100 | 25 | 10 | 60 | 300 | 300 |

With reference to FIG. 4, 16 stands for a channel insulating silicon nitride film. In this diagram, like parts found in FIG. 3 are denoted by like reference numerals. In this example, this invention is used for forming a gate silicon nitride film 11 and a gate silicon nitride film 12—amorphous silicon film 13—channel insulating silicon nitride film 14.

EXAMPLE 4

Figure 5:
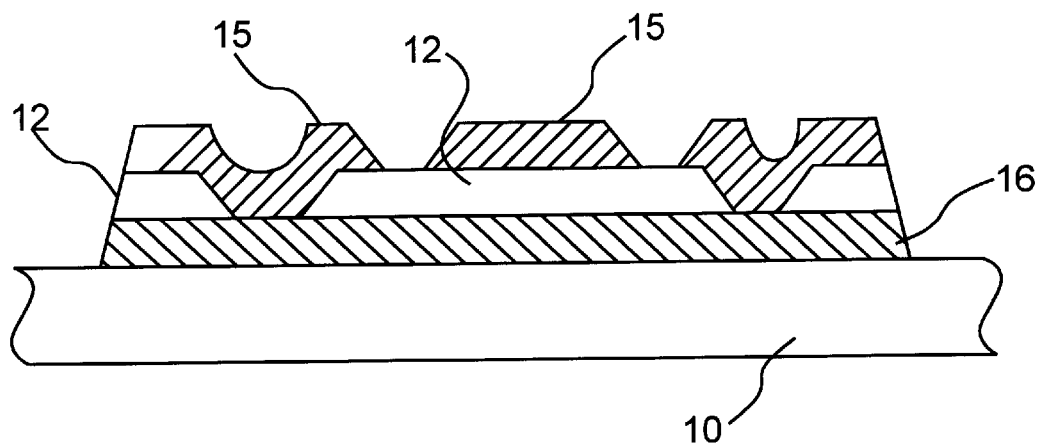
FIG. 5 is a diagram for schematically showing another channel etching type TFT manufactured by using this invention.

By the use of a CVD device using parallel planar plates shown in FIG. 1, a normal stagger type TFT shown in FIG. 5 was produced on a glass substrate 370 mm×470 mm in area by the well-known etching technique under the conditions of the film shown in Table 3.

TABLE 3

| Sequence | Step | Gas used |
|---|---|---|
| 1 | Discharge | $H_2$ |
| 2 | Formation of polycrystalline silicon | $H_2 + SiH_4$ |
| (3) | Discharge | $H_2$ |
| 4 | Discharge | $N_2 + NH_3$ |
| 5 | Formation of silicon oxide film | $N_2 + NH_3 + SiH_4$ |

With reference to FIG. 5, 16 stands for a polycrystalline silicon film. In this diagram, like parts found in FIG. 3 are denoted by like reference numerals.

Though this invention has the polycrystalline silicon film for 16, it may have an amorphous silicon instead. In this example, this invention is used for forming a polycrystalline silicon film—silicon nitride film.

INDUSTRIAL APPLICABILITY

According to the method of this invention for the formation of a thin film, since the substrate and the interior of the film-forming chamber are cleaned by being exposed to an activated atmosphere at the time that the discharge is started, this chamber is not required to be evacuated to a high degree of vacuum for the purpose of cleaning with a wide-range turbo molecule pump before or after the formation of the film and the thin film of fine quality can be formed quickly without suffering inclusion of impurities during the initial stage of the formation of the thin film.

Further, since the film-forming chamber has only to retain the interior thereof at such a degree of vacuum as falls in the approximate range of several Pa~300 Pa and, therefore, the evacuation of the chamber does not require a use of a pump capable of establishing a high degree of vacuum, the apparatus of this invention allows a cut in cost and a reduction in size and the operation thereof enjoys enhanced productivity.

Since the gas which in itself has no ability to form a film is used as the discharging gas, and the switch of the supply of this discharging gas to that of the reaction gases is carried out without inducing any change in the existing state of plasma, the formation of the thin film does not occur while the state of plasma is unstable during the initial stage of the discharge, and the film formed during the initial stage of a film deposition and the film formed thereafter are identical in quality. The fact that a component gas of the reaction gases is used as the discharging gas brings about an advantage that this discharging gas, when incorporated in the film, avoids exerting any adverse effect on the properties of the film and, particularly when the interface of the semiconductor thin film is treated with hydrogen gas plasma, gives rise to Si—H on the interface and rather goes to improve the properties of the semiconductor device to be produced.

This invention permits continuous formation of a thin film composed of a multiplicity of superposed layers by the use of a single film-forming chamber and, therefore, obtains the formation of the film efficiently and enjoys exalted productivity as compared with the conventional method for the formation of the thin film. In this case, the substrate which has the thin film formed thereon continues to remain under an activated gas. Even when a plurality of different kinds of films are continuously formed in the single film-forming chamber, therefore, the produced film is precluded from the otherwise inevitable entry of impurities into the individual kinds of films and is enabled to acquire a highly satisfactory property of interface separation.

Moreover, the repeatability of a film thickness is augmented because the control of the film thickness is accomplished by simply managing the duration of the supply of the gas which is responsible for the formation of the thin film.

What is claimed is:

1. A method for forming a thin film by setting a substrate in a vacuum vessel provided with a gas inlet and parallel planar electrodes disposed therein for generating a plasma discharge, and introducing one or more reaction gases through said gas inlet into said vacuum vessel while applying an alternating current to said reaction gases with said parallel planar electrodes thereby inducing a generation of plasma and deposition of said thin film comprising a reaction product of said reaction gases on said substrate, said method comprising the steps of:

prior to the introduction of said reaction gases, introducing a discharging gas comprising a component of said reaction gases, into said vacuum vessel while applying the alternating current to said discharging gas to induce generation of a plasma for a first period of time at a given gas pressure and alternating current value and to effect a pretreatment, wherein said discharging gas alone is incapable of forming said thin film; and thereafter introducing said reaction gases into said vacuum vessel while substantially retaining said generated plasma for a second period of time to form said thin film on said substrate.

2. A method according to claim 1, wherein the step of introducing said reaction gases into said vacuum vessel in place of said discharging gas is carried out, without substantially changing conditions for plasma generation, including not lowering the vacuum vessel pressure below 10 Pa, to form said thin film on said substrate.

3. A method for forming a thin film comprising a plurality of superposed layers by using a vacuum vessel provided with a gas inlet and parallel planar electrodes disposed therein for generating a plasma discharge, setting a substrate on one of said planar electrodes, and effecting formation of said thin film on said substrate, said method comprising the steps of:

introducing a discharging gas through said gas inlet into said vacuum vessel while applying an alternating current to said parallel planar electrodes to induce plasma generation; and stopping the introduction of the discharging gas and simultaneously introducing reaction gases into said vacuum vessel while retaining said plasma generation to form said thin film comprising a reaction product of said reaction gases on said substrate, wherein said step of introducing reaction gases includes forming a semiconductor thin film comprising a reaction product of one or more reaction gases, and wherein the discharging gas comprises at least one component gas of said reaction gases, the component gas alone being substantially incapable of forming said thin film in the presence of the plasma generation.

4. A method according to claims 1 or 3, wherein a period of time for the plasma generation during the introduction of said discharging gas is in the range of 10 to 40 percent of a period of time for the plasma generation during the introduction of said reaction gases.

5. A method according to claim 3, wherein said semiconductor thin film is formed of silicon and a non-oxygen element and said discharging gas is formed of said non-oxygen element.

6. A method according to claim 3, wherein said semiconductor thin film is formed of silicon and said discharging gas is hydrogen.

7. A method according to claim 3, wherein the introduction of said reaction gases into the vacuum vessel retaining the plasma generation is carried out while a gas pressure in said vacuum vessel and a magnitude of the alternating current are constant.

8. A method according to claim 3, wherein the step of introducing the discharging gas and the step of introducing the reaction gases are repeated in this order to form the plurality of superposed layers comprising a silicon nitride film and an amorphous silicon film.

9. A method according to claim 3, wherein the step of introducing the discharging gas and the step of introducing the reaction gases are repeated in this order to form the plurality of superposed layers comprising a first silicon nitride film, an amorphous silicon film, and a second silicon nitride film.

10. A method according to claim 9, wherein the step of introducing the discharging gas and the step of introducing the reaction gases are repeated in this order to form the plurality of superposed layers comprising a silicon oxide film, a first silicon nitride film, an amorphous silicon film, and a second silicon nitride film which constitute an inverted stagger amorphous silicon TFT.

11. A method according to claim 3, wherein said reaction gases comprise a silane gas having at least one member selected from the group consisting of hydrogen gas, nitrogen gas, and ammonia gas, and said discharging gas comprises at least one member selected from the group consisting of hydrogen gas, nitrogen gas, and ammonia gas.

12. A method for forming a thin film by setting a substrate in a vacuum vessel provided with a gas inlet and parallel planar electrodes disposed therein for generating a plasma discharge, and introducing reaction gases and a discharging gas through said gas inlet into said vacuum vessel while forming a plasma discharge herein and thereby forming at least two superposed thin films of a reaction product of said reaction gases on said substrate, said method comprising the steps of:

forming a first thin film on said substrate by introducing a first discharging gas and first reaction gases through said gas inlet into said vacuum vessel and forming a plasma discharge therein;

at least partly or wholly stopping the introduction of said first reaction gases thereby stopping the formation of said first thin film and, at the same time, substantially retaining said plasma discharge in said vacuum vessel; and forming a second thin film on said first thin film by introducing second reaction gases through said gas inlet into said vacuum vessel while substantially retaining said plasma discharge.

13. A method according to claim 12, wherein at least one of said first and second thin films is a semiconductor thin film containing silicon and a non-oxygen element.

14. A method according to claim 13, wherein said semiconductor thin film is formed under a hydrogen gas.

15. A method according to claim 12, wherein a period of time of said step of at least partly or wholly stopping the introduction of said first reaction gases and retaining said plasma discharge is in the range of 10 to 40 percent of a period of time of said step of forming said second thin film.

16. A method according to claim 12, wherein said step of forming said second thin film is attained by introducing said second reaction gases while a gas pressure and a magnitude of alternating current for retaining said plasma discharge remain constant.

17. A method according to claim 12, wherein said at least two superposed thin films include a silicon nitride film and an amorphous silicon film.

18. A method according to claim 12, wherein said at least two superposed thin films include a first silicon nitride film, an amorphous silicon film, and a second silicon nitride film.

19. A method according to claim 12, wherein said at least two superposed thin films include a silicon oxide film, a first silicon nitride film, an amorphous silicon film, and a second silicon nitride film, the superposed films constituting an inverted stagger amorphous silicon TFT.

20. A method according to claim 12, wherein said second reaction gases comprise a mixture of silane gas with at least one member selected from the group consisting of hydrogen gas, nitrogen gas, and ammonia gas.

21. A method for forming thin films by using a vacuum vessel provided with a gas inlet and parallel planar electrodes disposed therein for generating a plasma discharge, setting a substrate on one of said planar electrodes, and effecting formation of a plurality of superposed thin films on said substrate, said method comprising the steps of:

introducing a first discharging gas, the first discharging gas alone being substantially incapable of forming said thin films in the presence of plasma discharge, through said gas inlet into said vacuum vessel while applying an alternating current to said parallel planar electrodes thereby inducing generation of plasma;

forming a first thin film formed of a reaction product on said substrate by introducing first reaction gases through said gas inlet in the place of or in addition to said plasma discharging gas while substantially retaining said plasma discharge;

introducing a second discharging gas, the second discharging gas alone being substantially incapable of forming said thin films in the presence of plasma discharge, in the place of at least a part of a whole of said first reaction gases and substantially retaining said plasma discharge; and forming a second thin film formed of a semiconductor film on said first thin film by introducing second reaction gases in the place of or in addition to said second discharging gas while retaining said plasma discharge.

22. A method according to claim 21, wherein said second thin film is a semiconductor thin film containing silicon and a non-oxygen element.

23. A method according to claim 22, wherein said semiconductor thin film is formed under a hydrogen gas.

24. A method according to claim 21, wherein a period of time of said step of introducing a first discharging gas and retaining said plasma discharge is in the range of 10 to 40 percent of a period of time of said step of forming said second thin film.

25. A method according to claim 21, wherein the step of forming said second thin film is attained by introduction of said second reaction gases while a gas pressure and a magnitude of alternating current for retaining said plasma discharge remain constant.

26. A method according to claim 21, wherein said plurality of superposed thin films comprise a silicon nitride film and an amorphous silicon film.

27. A method according to claim 21, wherein said plurality of superposed thin films comprise a first silicon nitride film, an amorphous silicon film, and a second silicon nitride film.

28. A method according to claim 21, wherein said plurality of superposed thin films comprise a silicon oxide film, a first silicon nitride film, an amorphous silicon film, and a second silicon nitride film, the superposed films constituting an inverted stagger amorphous silicon TFT.

29. A method according to claim 21, wherein said second reaction gases comprise a mixture of silane gas with at least one member selected from the group consisting of hydrogen gas, nitrogen gas, and ammonia gas, and said second discharging gas is at least one member selected from the group consisting of hydrogen gas, nitrogen gas, and ammonia gas.

* * * * *